United States Patent
Kulkarni et al.

(10) Patent No.: US 10,217,509 B2
(45) Date of Patent: Feb. 26, 2019

(54) METHODS AND SYSTEMS TO SELECTIVELY BOOST AN OPERATING VOLTAGE OF, AND CONTROLS TO AN 8T BIT-CELL ARRAY AND/OR OTHER LOGIC BLOCKS

(71) Applicant: Intel Corporation, Santa Clara, CA (US)

(72) Inventors: Jaydeep P. Kulkarni, Hillsboro, OR (US); Bibiche M. Geuskens, Beaverton, OR (US); James Tschanz, Portland, OR (US); Vivek K. De, Beaverton, OR (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/495,954

(22) Filed: Apr. 24, 2017

(65) Prior Publication Data

US 2017/0243637 A1 Aug. 24, 2017

Related U.S. Application Data

(63) Continuation of application No. 14/989,762, filed on Jan. 6, 2016, now Pat. No. 9,633,716, which is a (Continued)

(51) Int. Cl.
*G11C 11/419* (2006.01)
*G11C 8/08* (2006.01)
(Continued)

(52) U.S. Cl.
CPC .......... *G11C 11/419* (2013.01); *G11C 11/412* (2013.01); *G11C 5/14* (2013.01);
(Continued)

(58) Field of Classification Search
CPC ... G11C 11/419; G11C 11/412; G11C 11/417; G11C 5/14; G11C 5/147; G11C 11/4074
(Continued)

(56) References Cited

U.S. PATENT DOCUMENTS 5,563,838 A * 10/1996 Mart ............... G11C 5/063
365/226
6,147,909 A * 11/2000 Fujio ............... G11C 5/145
365/185.23

(Continued)

FOREIGN PATENT DOCUMENTS

WO 2013147742 10/2013

OTHER PUBLICATIONS

International Search Report & Written Opinion dated Nov. 9, 2012 for PCT Patent Application No. PCT/US2012/030627.
(Continued)

*Primary Examiner* — Ly D Pham
(74) *Attorney, Agent, or Firm* — Green, Howard, & Mughal LLP

(57) ABSTRACT

Methods and systems to provide a multi-Vcc environment, such as to selectively boost an operating voltage of a logic block and/or provide a level-shifted control to the logic block. A multi-Vcc environment may be implemented to isolate a Vmin-limiting logic block from a single-Vcc environment, such as to reduce Vmin and/or improve energy efficiency in the single-Vcc environment. The logic block may include bit cells of a register file, a low-level processor cache, and/or other memory system. A cell Vcc may be boosted during a read mode and/or write wordlines (WWLs) and/or read wordlines (RWLs) may be asserted with boost. A wordline decoder may include a voltage level shifter with differential split-level logic, and a dynamic NAND, which may include NAND logic, a keeper circuit, and logic to
(Continued)

delay a keeper control based on a delay of the level shifter to reduce contention during an initial NAND evaluation phase.

19 Claims, 13 Drawing Sheets

Related U.S. Application Data continuation of application No. 14/350,546, filed as application No. PCT/US2012/030627 on Mar. 26, 2012, now Pat. No. 9,299,395.

(51) Int. Cl.
  *G11C 11/4074* (2006.01)
  *G11C 11/412* (2006.01)
  *G11C 11/417* (2006.01)
  *G11C 5/14* (2006.01)

(52) U.S. Cl.
  CPC ............ *G11C 5/147* (2013.01); *G11C 5/148* (2013.01); *G11C 8/08* (2013.01); *G11C 11/4074* (2013.01); *G11C 11/417* (2013.01)

(58) Field of Classification Search
  USPC ............. 365/154, 155, 156, 230.05, 189.09, 365/189.11
  See application file for complete search history.

(56) References Cited

U.S. PATENT DOCUMENTS

| | | | |
|---|---|---|---|
| 7,006,389 B2 | 2/2006 | Cordoba | |
| 7,061,820 B2* | 6/2006 | Deng | G11C 11/417 365/189.09 |
| 7,428,649 B2* | 9/2008 | Clark | H04B 1/1615 365/229 |
| 2004/0027907 A1* | 2/2004 | Ooishi | G11C 11/15 365/226 |
| 2005/0083736 A1* | 4/2005 | Fukui | G11C 5/147 365/185.18 |
| 2005/0237841 A1 | 10/2005 | Wu et al. | |
| 2006/0285401 A1 | 12/2006 | Pan | |
| 2007/0200593 A1 | 8/2007 | Agarwal et al. | |
| 2007/0211553 A1* | 9/2007 | Tada | G11C 11/417 365/227 |
| 2008/0043561 A1 | 2/2008 | Wang et al. | |
| 2008/0180157 A1 | 7/2008 | Choi et al. | |
| 2008/0181038 A1* | 7/2008 | Clinton | G11C 7/12 365/203 |
| 2008/0198678 A1 | 8/2008 | McClure et al. | |
| 2009/0097304 A1* | 4/2009 | Choi | G11C 7/20 365/163 |
| 2010/0027360 A1 | 2/2010 | Maiti et al. | |
| 2010/0103760 A1* | 4/2010 | Mair | G11C 5/147 365/227 |
| 2010/0213978 A1 | 8/2010 | Khatri et al. | |
| 2010/0315889 A1* | 12/2010 | Thomas | G11C 11/412 365/189.011 |
| 2011/0261609 A1* | 10/2011 | Seshadri | G11C 11/417 365/154 |
| 2012/0008449 A1 | 1/2012 | Chuang et al. | |
| 2012/0063211 A1 | 3/2012 | Sharma et al. | |

OTHER PUBLICATIONS

Non-Final Office Action dated May 8, 2015 for U.S. Appl. No. 14/350,546.
Non-Final Office Action, dated Aug. 15, 2016, for U.S. Appl. No. 14/989,762.
Notice of Allowance dated Oct. 5, 2017 for U.S. Appl. No. 14/989,762.
Notice of Allowance dated Aug. 3, 2015 for U.S. Appl. No. 14/350,546.
Notice of Allowance dated Nov. 30, 2015 for U.S. Appl. No. 14/350,546.
Khellah, M. et al., "A 256-Kb Dual-VCC SRAM Building Block in 65-nm Process with Actively Clamped Sleep Transistor", IEEE Journal of Solid State Circuits, vol. 42, No. 1, Jan. 2007, pp. 233-242.
Kumar et al., "A Family of 45nm IA Processors", IEEE International Solid-State Circuits Conference, 2009, pp. 58-59.
Raychowdhury et al., "PCT-and-Aging Adaptive Wordline Boosting for 8T SRAM Power Reduction", IEEE International Solid State Circuits Conference (ISSCC), Feb. 2010, pp. 351-353.

* cited by examiner

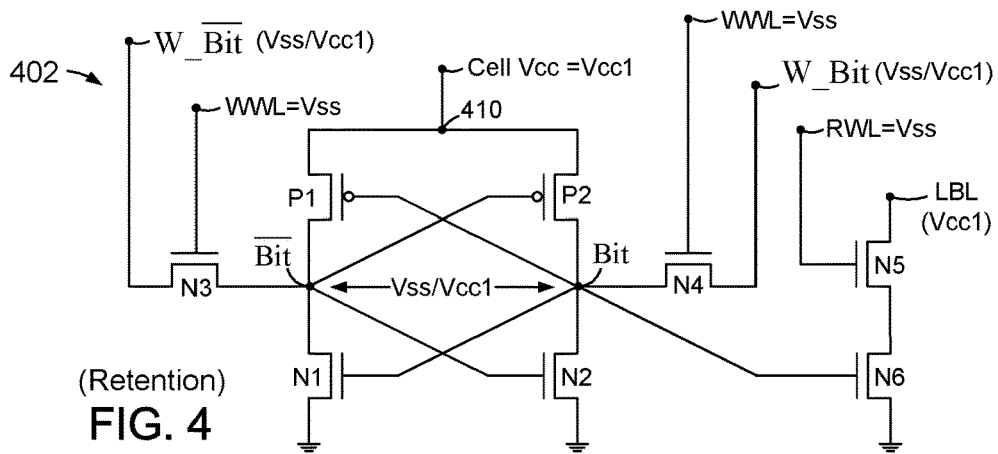
FIG. 4 (Retention)
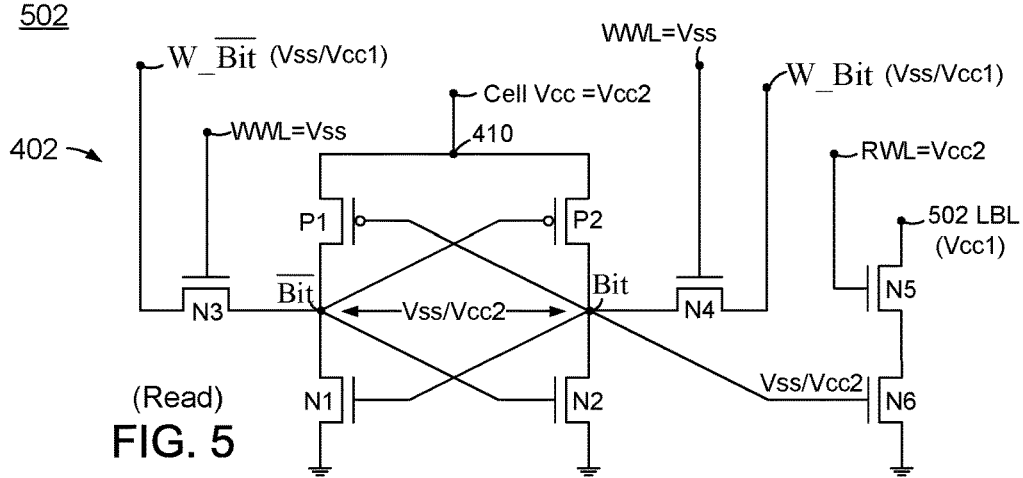
FIG. 5 (Read)
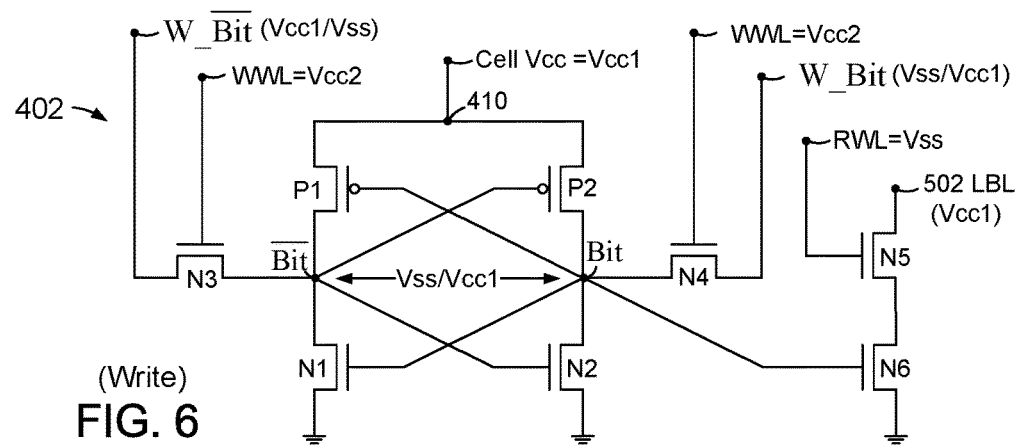
FIG. 6 (Write)

METHODS AND SYSTEMS TO SELECTIVELY BOOST AN OPERATING VOLTAGE OF, AND CONTROLS TO AN 8T BIT-CELL ARRAY AND/OR OTHER LOGIC BLOCKS

CLAIM FOR PRIORITY

This application is a continuation of U.S. patent application Ser. No. 14/989,762, filed 6 Jan. 2016, titled "METHODS AND SYSTEMS TO SELECTIVELY BOOST AN OPERATING VOLTAGE OF, AND CONTROLS TO AN 8T BIT-CELL ARRAY AND/OR OTHER LOGIC BLOCKS", issuing as U.S. Pat. No. 9,633,716 on 25 Apr. 2017, which is a continuation of U.S. Pat. No. 9,299,395, filed on 29 Mar. 2016, titled "METHODS AND SYSTEMS TO SELECTIVELY BOOST AN OPERATING VOLTAGE OF, AND CONTROLS TO AN 8T BIT-CELL ARRAY AND/OR OTHER LOGIC BLOCKS," which claims priority to PCT Patent Application Serial No. PCT/US2012/030627, filed on 26 Mar. 2012, titled "METHODS AND SYSTEMS TO SELECTIVELY BOOST AN OPERATING VOLTAGE OF, AND CONTROLS TO AN 8T BIT-CELL ARRAY AND/OR OTHER LOGIC BLOCKS," all of which are incorporated herein by reference in their entirety for all purposes.

STATEMENT OF GOVERNMENT INTEREST

This invention was made with U.S. Government support under contract number HR0011-10-3-0007 awarded by the Department of Defense. The Government has certain rights in this invention.

BACKGROUND

A processor may include multiple registers, which may be implemented as an array of memory bit cells, referred to as a register file. A register file may be implemented with static random access memory (SRAM) bit cells having dedicated or decoupled read and write ports, which may be implemented 8 transistor devices, also referred to as dual-port or 8T bit cells. A dual-port or 8T bit cell may provide faster read (RD) and write (WR) completion times, and may permit a lower operating voltage than a single access port or 6T bit cell.

Integrated circuits are being implemented with increasingly smaller sizes, which may tend to increase variations in die-to-die (D2D) and within-die (WID) process parameters. The variations may be at least partially mitigated with larger-size devices for read and write ports, allowing the circuits to operate at low voltage but at the potential cost of a higher power at high performance mode with higher switching capacitance.

BRIEF DESCRIPTION OF THE DRAWINGS/FIGURES

FIG. 4 is a circuit diagram of a bit cell, with example standby mode voltages.

FIG. 5 is a circuit diagram of the bit cell of FIG. 4, with example read mode voltages.

FIG. 6 is a circuit diagram of the bit cell of FIG. 4, with example write mode voltages.

Figure 1:
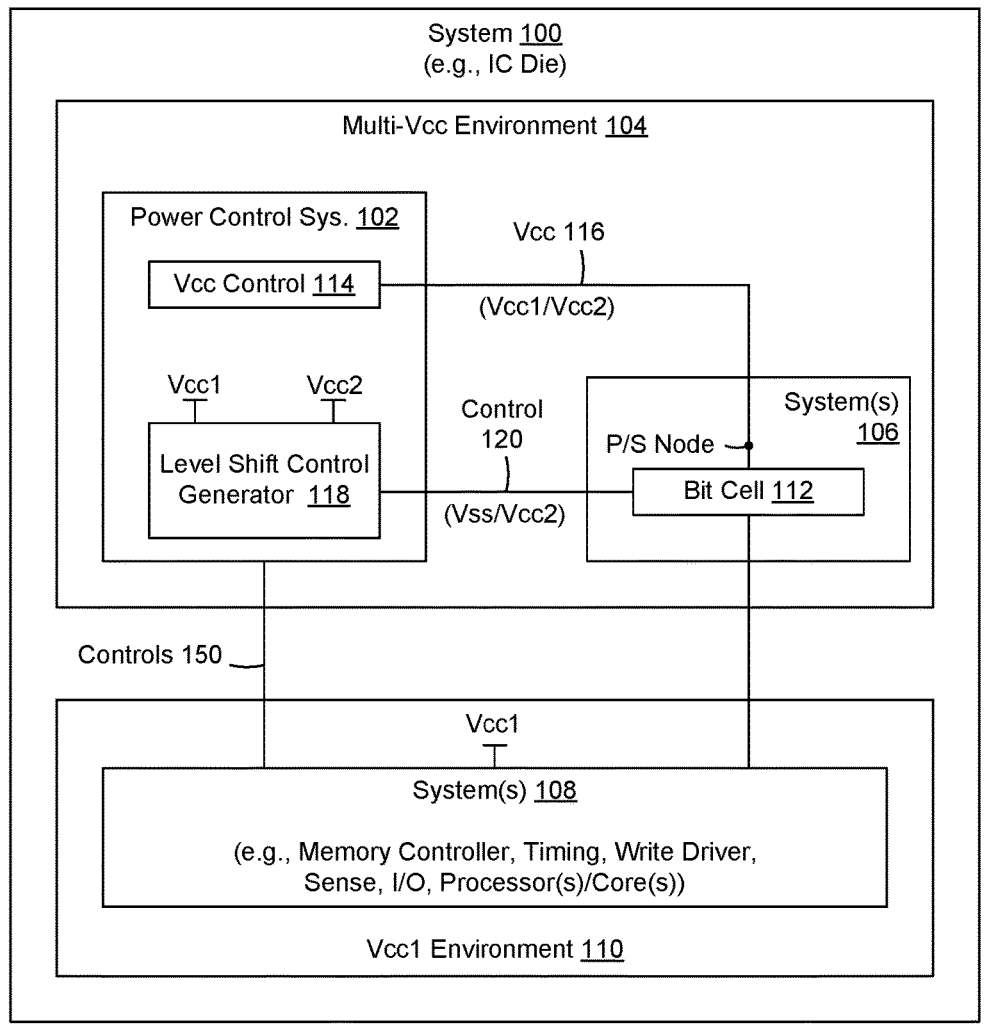
FIG. 1 is block diagram of a power control system to provide a multi-Vcc environment for one or more systems or logic blocks.

In the drawings, the leftmost digit(s) of a reference number identifies the drawing in which the reference number first appears

DETAILED DESCRIPTION

FIG. 1 is block diagram of a system 100, including a power control system 102 to provide a multi-Vcc environment 104 for one or more systems 106.

System 100 may include multiple voltage rails, illustrated here as Vcc1 and Vcc2. Vcc1 may be shared amongst or provided to one or more circuits or logic blocks, illustrated here as systems 108, which may operate across a relatively wide dynamic voltage and/or frequency (DVFS) range.

Vcc1 may be fixed or variable.

A lower limit of Vcc1, referred to herein as Vmin, of Vcc1, may correspond to a minimum operating voltage of systems 108. Conventionally, where the minimum voltage of one system is higher than the minimum voltage of one or more other systems, Vmin may be limited to the higher voltage, and the system may be referred to as a Vmin-limiting system.

Power control system 102 may be implemented to provide multi-Vcc environment 104 for one or more systems 110, which might otherwise constitute a Vmin-limiting system in a Vcc1 environment 110. In other words, power control system 102 may be implemented to remove or isolate Vmin-limiting systems from Vcc1 environment 110. This may permit more-aggressive core-Vcc scaling of systems 108 in Vcc1 environment 110, which may improve overall energy efficiency. Implementations of power control system 102 are not, however, limited to this example.

Vcc1 may be generated off-die or on-die, and may be generated or regulated with a switched-capacitor voltage regulator (SCVR). A SCVR may provide a relatively low supply voltage with relatively high power efficiency.

Vcc2 may be generated on-die, and may be generated or regulated with a local low dropout regulator (local LDO), which may also be used as a pass transistor or power gate to place systems 106 in a reduced power-consumption state.

Vcc1 may be minimized based on systems 108, and power control system 102 may be implemented to provide a higher operating voltage to systems 106 and/or to provide level-shifted control 120 to systems 106.

System 106 may include one or more memory bit cells, illustrated here as a bit cell 112. Bit cell 112 may include contention-based storage circuitry to store a logic value, and may include one or more access gates to write to and/or read from the storage circuitry. Examples are provided herein with reference to a bit cell having dedicated or decoupled write and read ports, such as an 8T bit cell. Examples are also provided herein with respect to multiple bit cells implemented as a register file and/or a low-level processor cache. Methods and systems disclosed herein are not, however, limited to memory bit cells, 8T bit cells, register files, or processor cache.

Power control system 102 may include a Vcc control system 114 to control an operating voltage Vcc 116 of systems 106. Vcc control system 114 may be implemented, for example, to set Vcc 116 of bit cell 112 to Vcc1 during a retention mode and/or a write mode, to maintain contention of the storage circuitry with minimal power. Vcc control system 114 may be further implemented to increase or switch Vcc 116 to Vcc2 during a read mode, which may help to overcome contention within a read or sense system, and may improve a read completion time.

Power control system 102 may include a level-shift control generator (LS control generator) 118 to generate, level-shift, and assert a control 120 to systems 106 at Vcc2. LS control generator 118 may be implemented to generate control 120 based on one or more controls, clocks, and/or data (controls) 150, having a voltage swing of Vcc1, defined as a difference between Vcc1 and a voltage reference, Vss.

LS control generator 118 may include a level-shift word-line decoder to generate control 120 as a write wordline (WWL) and/or a read wordline (RWL). Assertion of a WWL at Vcc2 may help to overcome contention within bit cell 112, and may improve a write completion time. Assertion of a RWL at Vcc2 may help to help to overcome contention within a read or sense system, and may improve the read completion time.

Power control system 102 may be implemented to control Vcc 116 in conjunction with control 120.

System 100 may be implemented with an integrated circuit (IC) die, and may include an array of bit cells 112, which may be implemented, for example, as a processor register, a register file, and/or a low-level cache.

Figure 2:
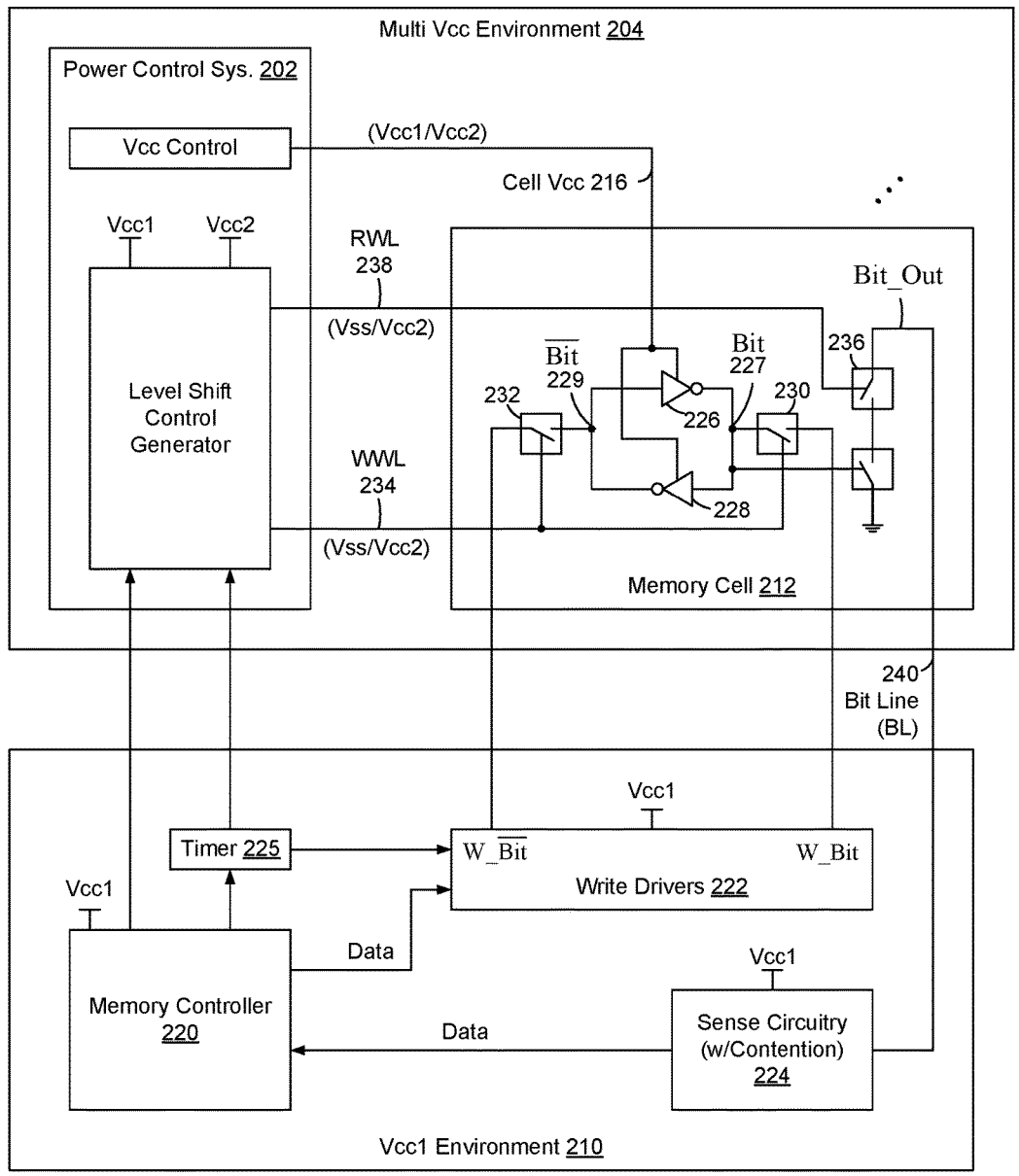
FIG. 2 is a block diagram of a power control system to provide a multi-Vcc environment for a memory bit cell, such as to provide selective power supply boost, read wordline (RWL) boosting, and/or write wordline (WWL) boosting.

FIG. 2 is a block diagram of a system 200, including a power control system 202 to provide a multi-Vcc environment 204 for a contention-based bit cell 212, such as to provide selective power supply boost, read wordline (RWL) boosting, and/or write wordline (WWL) boosting.

System 200 may further include one or more systems within a Vcc1 environment 210, illustrated here as including a memory controller 220, timer circuitry 225, write drivers 222, and sense circuitry 224.

Bit cell 212 may include contention-based storage circuitry, illustrated here as cross-coupled inverters 226 and 228, to assert and maintain opposing logic values or states, Bit and $\overline{\text{Bit}}$, at nodes 227 and 229. Opposing logic values or states may also be referred to as non-inverted and inverted logic values, and differential logic values.

For illustrative purposes, a logic value 1 may correspond to an operating voltage, cell Vcc 216, and logic value 0 may correspond to a voltage reference, Vss.

During a write operation or write mode, write gates 230 and 232 may be closed, or turned-on with a WWL 234 to write W_Bit and W_$\overline{\text{Bit}}$ to nodes 227 and 229 of bit cell 212, as Bit and $\overline{\text{Bit}}$ respectively. When overwriting existing logic states at nodes 227 and 229, write gates 230 and 234 may face contention from inverters 226 and 228.

During a read operation or read mode, a read gate 236 may be closed or turned-on with a RWL 238 to couple node 229 to a bit line (BL) 240. Alternatively, or additionally, bit cell 212 may include another read gate to couple node 227 to another bit line. During the read mode, gate 236 may face contention from circuitry within sense circuitry 224, such as described below with reference to FIG. 3.

Figure 3:
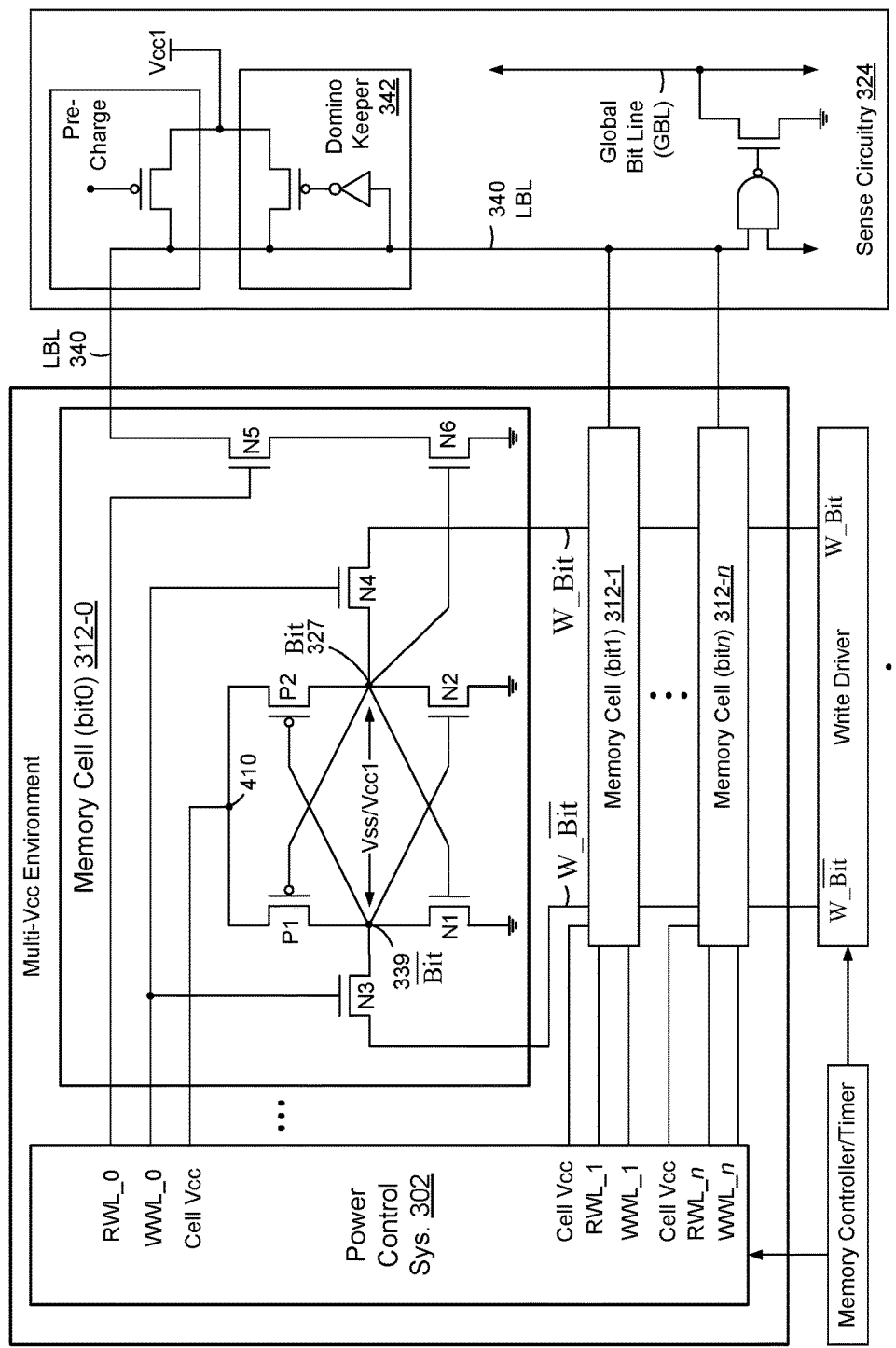
FIG. 3 is a block diagram of a memory system including multiple bit cells and sense circuitry.

FIG. 3 is a block diagram of a system 300, including multiple bit cells 312 and sense circuitry 324 to sense logic states of bit cells 312. Bit cell 312-0 is described below. Remaining bit cells 312 may be implemented similar to bit cell 312-0.

Bit cell 312-0 includes 8 transistor devices, P1 and P2, and N1 through N6. Bit cell 312-2 may be referred to as 8T bit cell.

Devices P1 and N1, and devices P2 and N2, are implemented as cross-coupled inverters to assert opposing Bit and $\overline{\text{Bit}}$ at nodes 327 and 329.

Devices N3 and N4 provide a dedicated or decoupled write port to write W_Bit and W_$\overline{\text{Bit}}$ to nodes Bit and $\overline{\text{Bit}}$.

Devices N5 and N6 provide a dedicated or decoupled single-ended read port to read or sense Bit at node 327 through a local bit line (LBL) 340. LBL 340 may be implemented as a domino-style hierarchal read bit line with a domino keeper circuit 342. A decoupled single-ended RD port with a domino-style hierarchal read bit line may provide a relatively fast read evaluation path with relatively little access disturbance, which may permit bit cell 312-0 to operate at a relatively low Vcc in read mode.

System 300 may be implemented as a low-level cache and/or dual-port register-file array of a single-Vcc processor. Memory system 300 is not, however, limited to these examples.

System 300 may include a power control system 302 to provide a multi-Vcc environment for bit cells 312. Power control system 302 may be implemented, for example, to control the cell Vcc, and/or to provide read and/or write assist at Vcc2. Read and/or write assist may include selective increase of the cell Vcc, WWL boosting, and/or RWL boosting. Other systems, such as sense circuitry 324, write drivers, memory controller, and/or timer circuitry, may be implemented to operate within a Vcc1 environment.

A power control system, as disclosed herein, may be implemented in accordance with Table 1 below, or portions thereof. Examples are provided below with reference to FIGS. 4, 5, and 6. Methods and systems disclosed herein are not, however, limited to these examples.

TABLE 1

| | Mode | | |
|---|---|---|---|
| | Standby | Read | Write |
| Cell Vcc | Vcc1 | Vcc2 | Vcc1 |
| RWL | Vss | Vcc2 | Vss |
| WRL | Vss | Vss | Vcc2 |

FIGS. 4, 5 and 6 are circuit diagrams of a bit cell 402, with example voltages for a retention mode 400 FIG. 4, a read mode 500 in FIG. 5, and a write mode 600 in FIG. 6.

Bit cell 402 includes a first inverter (devices P1 and N1), and a second inverter (devices P2 and N2). The first and second inverters are cross-coupled to assert inverted logic values as Bit and $\overline{Bit}$. For example, a Vcc (i.e., logic 1) at Bit turns P1 off and N1 on to couple $\overline{Bit}$ to Vss or ground (i.e., logic 0). Conversely, Vss (logic 0) at Bit turns N1 off and P1 on to couple $\overline{Bit}$ to Vcc (i.e., logic 1).

Bit cell 402 further includes write gates N3 and N4, and read gates N5 and N6.

In standby mode 400 (FIG. 4), WWL and RWL are at Vss to turn off write gates N3 and N4 and read gate N5, and Vcc1 is applied to a power supply node 410 to maintain states at Bit and $\overline{Bit}$ with a voltage difference or swing of Vss/Vcc1.

In read mode 500 (FIG. 5), Vcc2 may be applied to power supply node 410 to increase the voltage difference between nodes Bit and $\overline{Bit}$ to Vcc2. Where Bit is at logic 1, N6 turns on with Vcc2 rather than Vcc1, which may help overcome contention of sense circuitry on a local bit line (LBL) 502. Alternatively, or additionally, RWL may be asserted at Vcc2 rather than Vcc1, which may help to overcome contention of sense circuitry on LBL 502.

In write mode 600 (FIG. 6), WWL may be asserted at Vcc2 rather than Vcc1, and Vcc1 may be applied to power supply node 410 rather than Vcc2, which may help to overcome write contention at Bit and $\overline{Bit}$.

Figure 7:
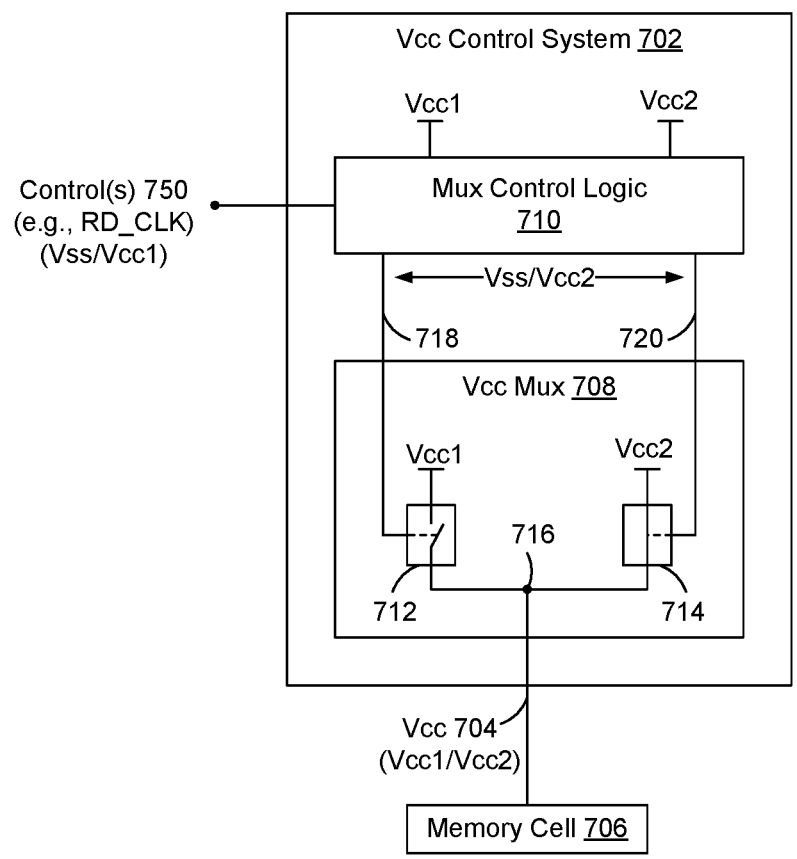
FIG. 7 is block diagram of a Vcc control system to provide one of multiple selectable voltages as a power supply node of a system, such as a bit cell.

FIG. 7 is block diagram of a Vcc control system 702 to provide one of multiple selectable voltages to a power supply node of a system, illustrated here as including a bit cell 706. Bit cell 704 may be implemented as described in one or more examples herein. Vcc control system 702 may represent an example implementation of Vcc control system 114 in FIG. 1.

Vcc control system 704 may include a Vcc multiplexer (Vcc mux) 708 and mux control logic 710.

Vcc mux 708 may include multiple gates or switch devices 712 and 714, each to couple a power supply node 716 of bit cell 706 to a corresponding one of voltage rails Vcc1 and Vcc2.

Mux control logic 710 may be implemented to control devices 712 and 714 with differential controls 718 and 720 based on one or more controls 750. Control(s) 750 may include a read clock or a sector-specific read clock, which may be generated in a timer system. Control(s) 750 may have a voltage swing of Vcc1, and differential controls 718 and 720 may have a voltage swing of Vcc2.

Mux control logic 710 may be implemented to switch differential controls 718 and 720 with substantially equal rise time delays and fall time delays, such as described below with reference to FIG. 12.

Figure 8:
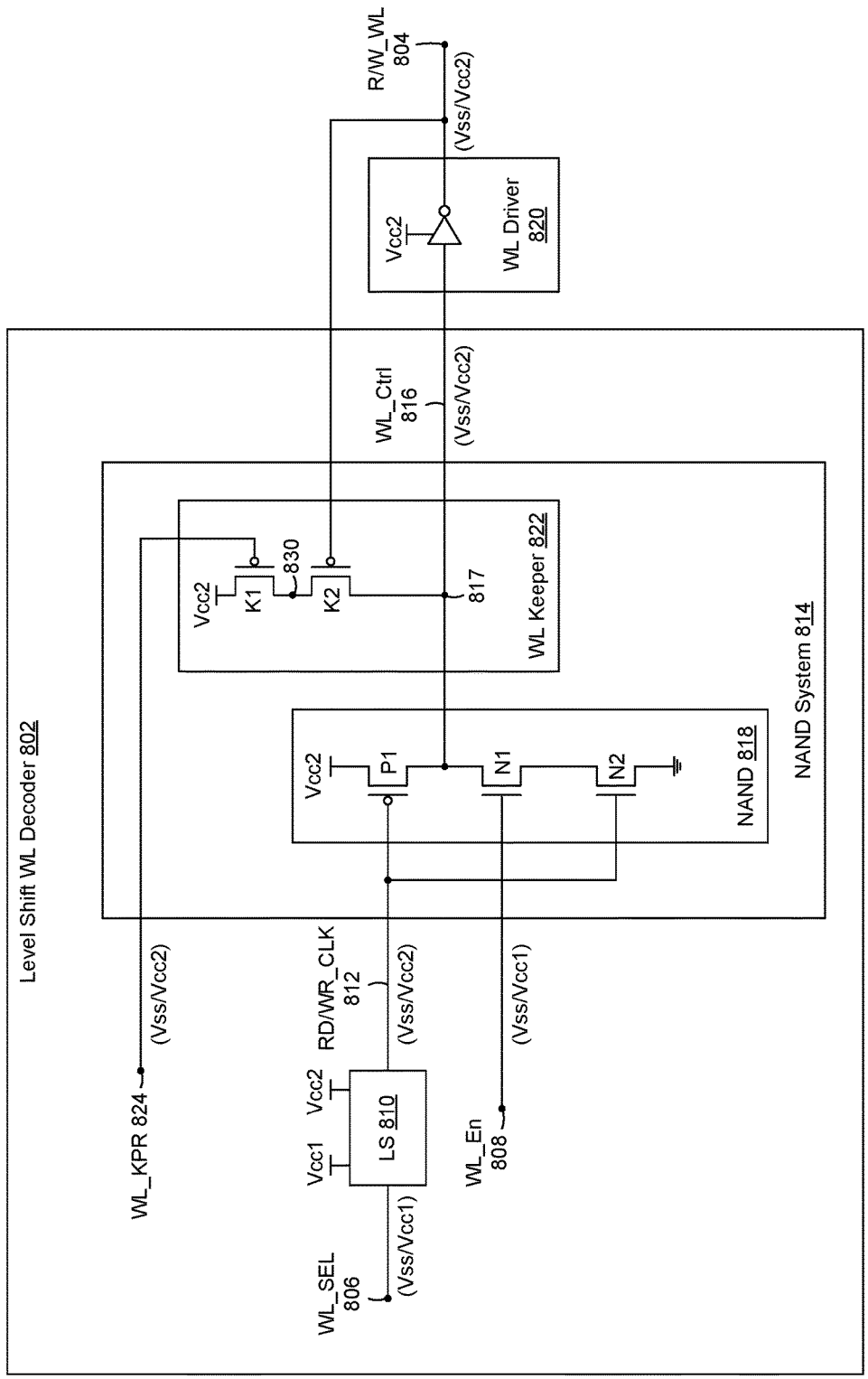
FIG. 8 is block diagram of a dynamic NAND-based level-shift wordline decoder (WL decoder) to assert a level-shifted or voltage boosted RWLs and/or WWLs.

FIG. 8 is block diagram of a level-shift wordline decoder (WL decoder) 802 to generate and assert a wordline control R/W_WL 804 at Vcc2, based on inputs having a voltage swing of Vcc1. R/W_WL 804 may represent a WWL and/or RWL.

WL decoder 802 may represent an implementation of level-shift control generator 118 in FIG. 1.

WL decoder 802 may include a voltage level shifter 810 to level shift a control WL_SEL 806 from a voltage swing of Vcc1 to a voltage swing of Vcc2. WL_SEL 806 may be generated based on a read and/or write clock and a sector select control, such as described below with reference to FIG. 10.

WL decoder 802 may further include a NAND system 814 to evaluate RD/WR_CLK 812 and a wordline enable control WL_En 808. WL_En 808 may have voltage swings of Vcc1, and may be generated based on a sector select control and a lower-order address bit, such as described below with reference to FIG. 10.

NAND system 814 may include NAND logic 818 to generate a wordline control WL_Ctrl 816 at a node 817.

NAND logic 818 may be implemented to pull node 817 up towards Vcc2 through a device P1 when input 812 is at Vss, which may correspond to a pre-charge mode.

NAND logic 818 may be implemented to pull node 817 down towards Vss through devices N1 and N2 when inputs 812 and 808 are at Vcc2 and Vcc1, respectively, which may correspond to a write or read mode.

NAND system 814 may include a wordline driver 820, which may include an inverter to assert Vcc2 on R/W_WL 814 in write or read mode, when node 817 is at Vss. In other words, NAND system 814 may be implemented to provide WWL boost and/or RWL boost.

When NAND logic 818 asserts Vcc2 at node 817, a leakage current may flow from node 817 to Vss through devices N1 and N2.

NAND system 814 may include a wordline keeper (WL keeper) 822 to compensate for the leakage current. WL keeper 822 may include a device K1 to pull-up a node 830 to Vcc2. WL keeper 822 may further include a device K2 to couple node 817 to node 830 when output 804 is inactive at Vss, and to de-couple node 817 from node 830 when output 804 is active at Vcc2.

In a static implementation, a gate of device K1 may be coupled to Vss to maintain WL keeper 822 in an on state. The static implementation may result cause contention at node 817 when NAND circuitry 818 pulls node 817 from Vcc2 to Vss. The contention may delay completion of the transition, and may result in a corresponding assertion delay on output 804.

Alternatively, WL keeper 822 may be implemented as a dynamic keeper to reduce or eliminate contention at node 817 during an initial part of the NAND evaluation phase. A dynamic implementation may reduce NAND evaluation time, and may be implemented to recover a delay penalty of voltage level shifter 810. Dynamic control may be implemented in logic to generate a keeper control WL_KPR 824. The dynamic control logic may be implemented to delay turn-on of device K1. Activation of WL_KPR 824 may be delayed, for example, by an amount of delay imparted by level-shifter 810.

During the delay, device K2 is off to isolate node 817 from Vcc2. After the delay, WL_KPR 824 is pulled down to Vss to enable device K1 to pull-up and hold node 817 at Vcc2, depending upon a state of output 804.

WL decoder may include a second voltage level shifter to generate WL_KPR 824, which may be similar to voltage level shifter 812 to provide substantially equal delay.

Alternatively RD/WR_CLK 812 may be provided to device K1 as WL_KPR 824.

Where WL keeper 822 is dynamically controlled, NAND system 814 may referred to as a dynamic NAND system. A dynamic NAND system, or a portion thereof, may be shared amongst multiple wordlines, such as described below with reference to FIG. 9.

Figure 9:
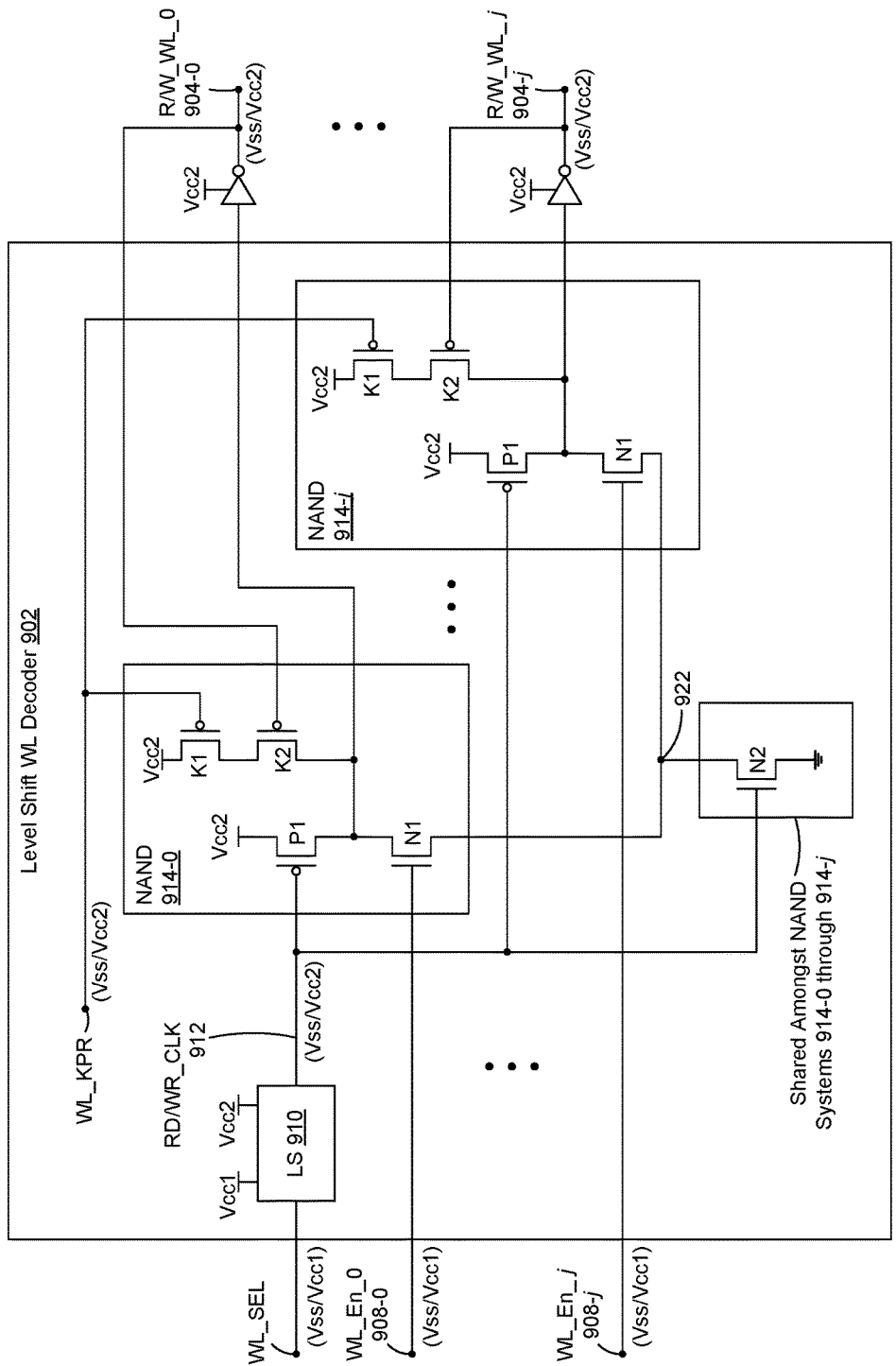
FIG. 9 is block diagram of a level-shift WL decoder 902, including multiple NAND systems to generate multiple corresponding wordline controls 904, with circuitry shared amongst the NAND systems.

FIG. 9 is block diagram of a level-shift WL decoder 902, including multiple NAND systems 914 to generate multiple corresponding wordline controls 904, with circuitry shared amongst NAND systems 914.

NAND systems 914 may each be implemented to receive a clock RD/WR_CLK 912 and a corresponding wordline enable 908.

NAND systems 914 may be further implemented to share device N2 to couple nodes 922 of NAND circuits 914 to Vss when any one wordline controls 904 is to be asserted. Sharing of device N2 may reduce NAND evaluation time.

NAND systems 914, in combination with device N2, may each operate substantially as described above with reference to NAND system 814 in FIG. 8.

A dynamic NAND system may be implemented in place of multiple per-WWL or per-RWL static NAND circuits.

Figure 10:
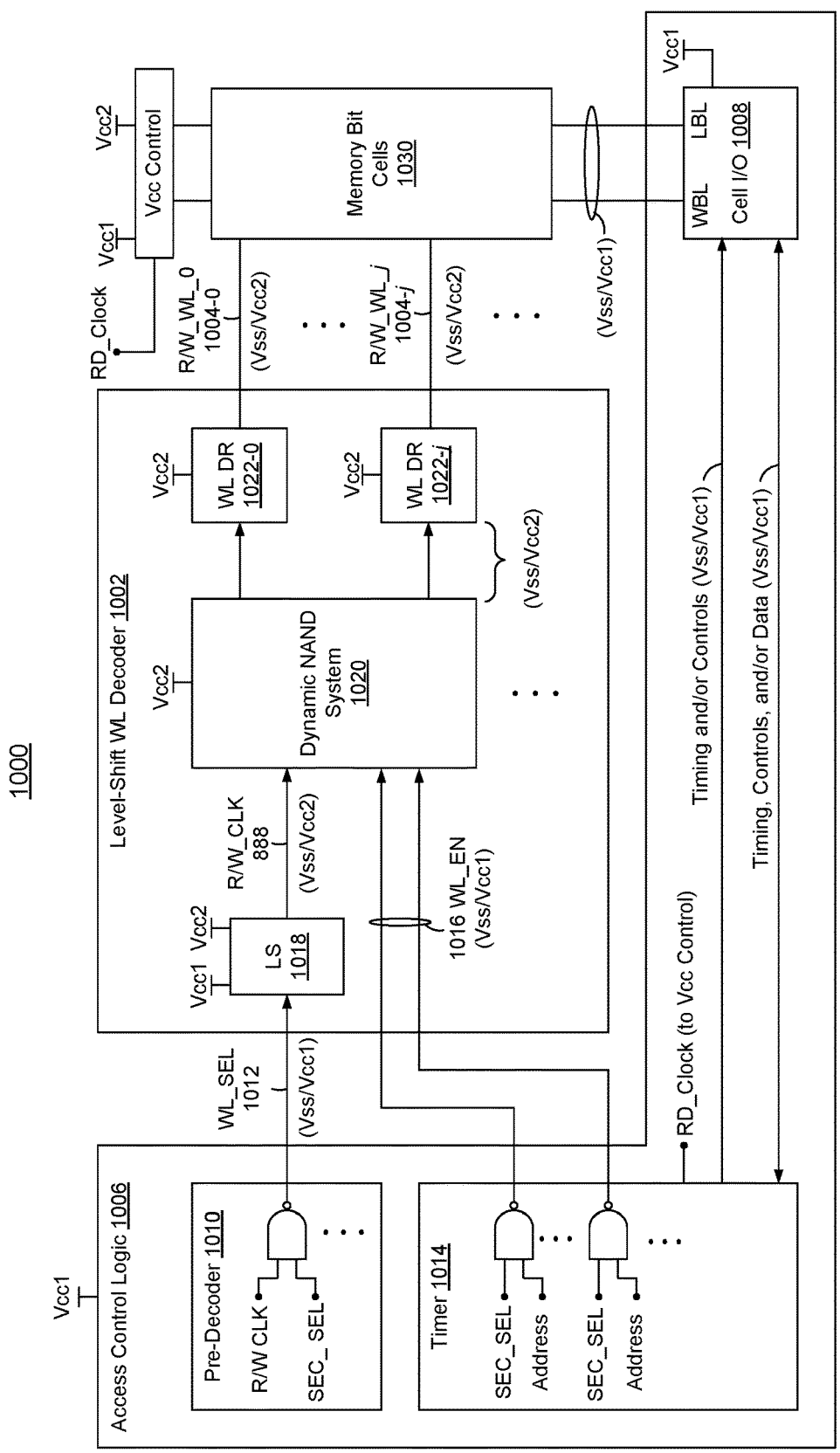
FIG. 10 is a block diagram of a memory system including memory bit cells, memory access control logic to generate clocks and/or controls with a first voltage swing, and a level-shift WL decoder to generate and assert multiple wordline controls with a second voltage swing.

FIG. 10 is a block diagram of a memory system 1000, including memory bit cells 1030, memory access control logic 1006 to generate clocks and/or controls with voltage swings of Vcc1, and a level-shift WL decoder 1002 to generate and assert multiple wordline controls 1004 at Vcc2, such as described above with reference to FIG. 9.

Memory access control logic 1006 may include one or more of pre-decoder logic 1010, timer logic 1014, and/or bit cell input/output (I/O) logic 1008, which may include wordline drivers, pre-charge logic, and/or sense logic.

In the example of FIG. 10, pre-decoder logic 1010 includes logic to generate a wordline select control 1012 based on a read and/or write clock, illustrated here as R/W_CLK, and a sector select control SEC_SEL.

Timer logic 1014 includes logic to generate per-wordline, or wordline-specific enable controls 1016 based on the SEC_SEL control and corresponding wordline-specific lower-order address bit(s).

In FIG. 10, access control logic 1006 and WL decoder 1002 are illustrated with logic to support a set of j+1 wordlines. The illustrated logic may be replicated to support additional sets of j+1 wordlines.

Figure 11:
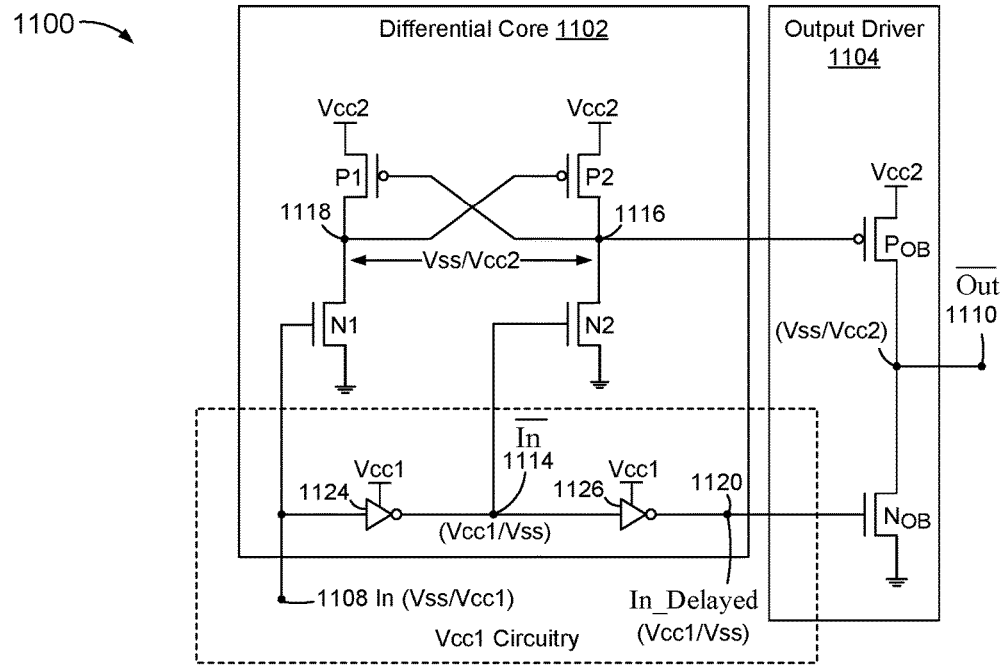
FIG. 11 is a circuit diagram of an inverting, split-level, level-shifter, which may be implemented to level shift controls to a dynamic NAND based WL decoder of FIG. 8, 9, and/or 10.

FIG. 11 is a circuit diagram of a voltage level shifter (LS) 1100, including a differential circuit or core 1102, and an output driver 1104. LS 1100 may represent an example implementation of level shifter 810 in FIG. 8, level shifter 910 in FIG. 9, and/or level shifter 1018 in FIG. 10.

When Vss is applied to an input 1108, a node 1114 is pulled up to Vcc1 by an inverter 1124, and a node 1120 is pulled down to Vss by an inverter 1126.

In addition, a device N1 turns off to isolate node 1118 from Vss, and a device N2 turns on pull down node 1116 to Vss. When node 1116 is pulled down to Vss, P1 turns on to pull-up node 1118 to Vcc2, which turns P2 off to isolate node 1116 from Vcc2.

Conversely, when Vcc1 is applied to input 1108, node 1114 is pulled down to Vss and node 1120 is pulled up to Vcc1. In addition, N1 turns on to pull down node 1118 to Vss, and N2 turns off to isolate node 1116 from Vss. When node 1118 is pulled down to Vss, P2 turns on to pull up node 1116 to Vcc2, which turns P1 off to isolate node 1118 from Vcc2.

Thus, when Vss is applied to input 1108, nodes 1116 and 1120 are pulled down to Vss. When Vcc1 is applied to input 1108, nodes 1116 and 1120 are pulled up to Vcc2 and Vcc1, respectively.

Node 1114 represents an inverted version of input 1108, node 1120 represents delayed version of input 1108, and node 1116 represents a level-shifted delayed version of input 1108. A delay at node 1120, in terms of rise time and/or fall time relative to input 1108 may be substantially equal to a delay at node 1116.

Regarding output driver 1104, when nodes 1116 and 1120 are pulled down to Vss, a device $N_{OB}$ turns OFF to isolate an output 1110 from Vss, and a device $P_{OB}$ turns on to pull-up output 1110 to Vcc2. Conversely, when nodes 1116 and 1120 are pulled-up to Vcc2 and Vcc1, respectively, $P_{OB}$ turns off to isolate output 1110 from Vcc2, and $N_{OB}$ turns on to pull down output 1110 to Vss. Output driver 1104 thus inverts the states at nodes 1116 and 1120, and drives the result a logic value 1 with Vcc2.

Differential core 1102 may be referred to as a split-level differential in view of node 1120 having a voltage swing of Vcc1 and node 1116 having a voltage swing of Vcc2.

Similarly, output driver 1114 may be referred to as a split-level inverting output driver, and LS 1100 may be referred to as an inverting, split-level, level shifter.

Figure 12:
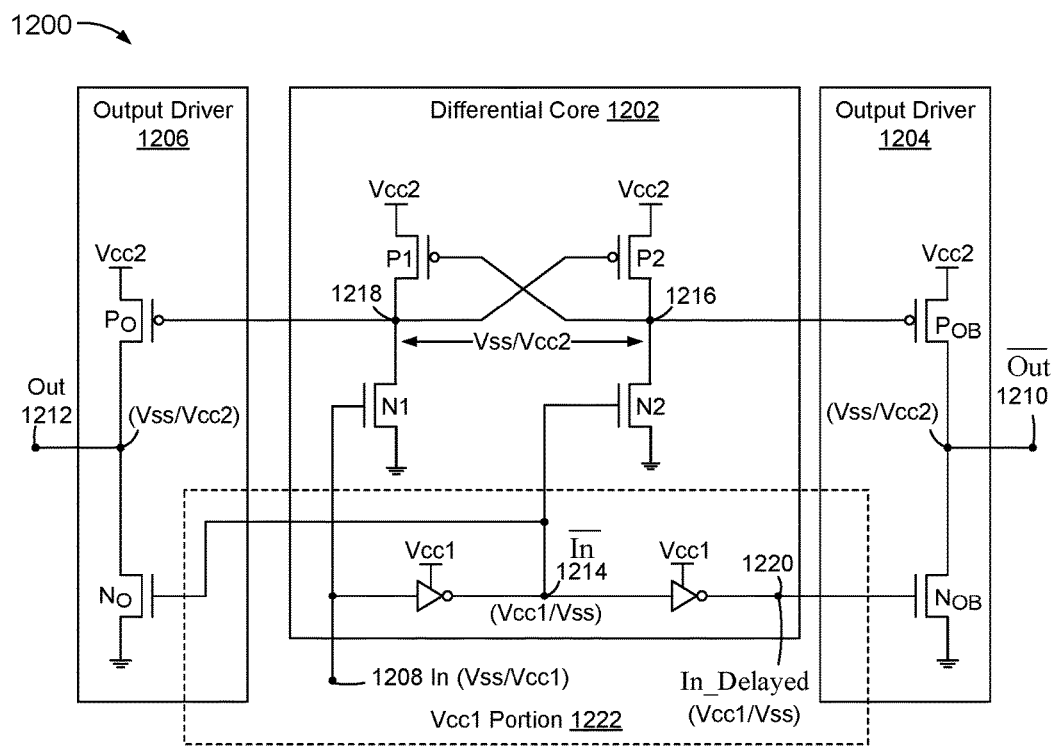
FIG. 12 is a circuit diagram of differential or dual-output, split-level, level-shifter, which may be implemented to control an operating voltage of a logic block.

FIG. 12 is a circuit diagram of a level shifter (LS) 1200, including a differential circuit or core 1202, and first and second output drivers 1204 and 1206. LS 1200 may represent an example implementation of level-shift Vcc mux control system 710 in FIG. 7.

Differential core 1202 may be similar to differential core 1102 in FIG. 11, and output drivers 1204 and 1206 may be similar to output driver 1104 in FIG. 11.

As described above with reference to nodes 1116 and 1118 in FIG. 11, opposing or differential logic states are asserted at nodes 1216 and 1218 in FIG. 12. Thus, opposing or differential logic states are asserted at outputs 1210 and 1212.

Level shifter 1210 may be referred to as a differential or dual-output, split-level, level-shifter.

A delay at output 1210, in terms of rise time and/or fall time relative to input 1208, may be substantially equal to a delay at output 1212. The delay at outputs 1210 and 1212 may be substantially equal to the delay at output 1110 of level shifter 1100 in FIG. 11. Equal rise time and/or fall time delay within and/or amongst levels shifters may help to minimize effects of delay on critical races, such as read wordline (RWL)-to-pre-charge (PCH) race in read mode.

Figure 13:
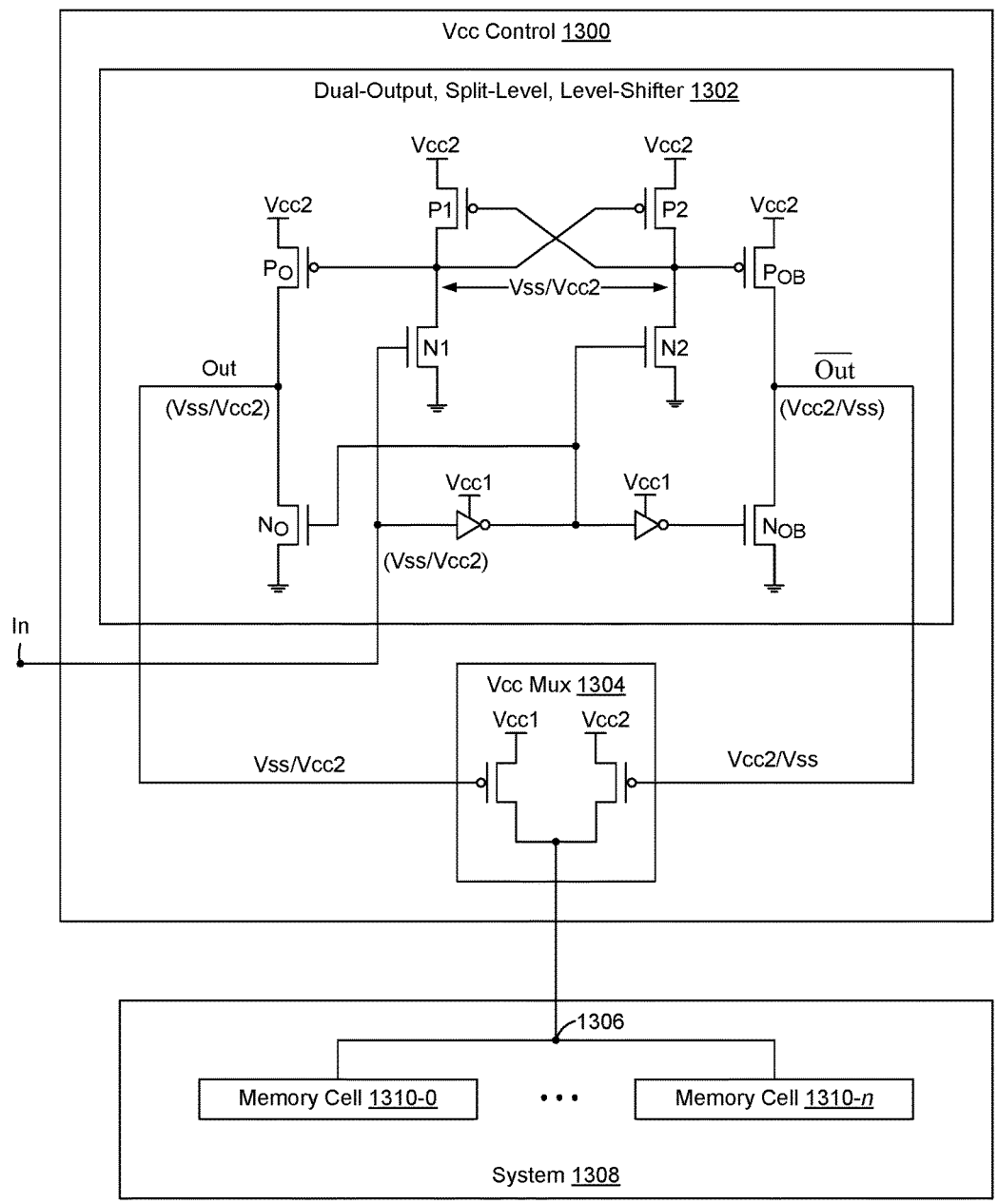
FIG. 13 is a circuit diagram of a Vcc control system including differential or dual-output, split-level, level-shifter implemented to control operating voltages of multiple memory cells.

FIG. 13 is a circuit diagram of a Vcc control system 1300 including a dual-output, split-level, level shifter 1302, such as described above with reference to FIG. 12, and a Vcc mux 1304. Vcc control system 1300 may represent an implementation of Vcc control system 702 in FIG. 7.

Vcc control system 1300 may be implemented to provide one of multiple selectable voltages to a power supply node 1306 of a system 1308. System 1308 may include multiple bit cells 1310, such as described in one or more examples herein.

Vcc control system 1300 may be implemented to maintain power supply node 1306 at Vcc1 in standby mode and/or write mode, and to increase or switch the voltage at node 1306 to Vcc2 during read mode.

Vcc control system 1300 and/or Vcc mux 1304 may be implemented to selectively increase or switch the operating voltage to Vcc2 for each of multiple subsets of bit cells, such as described below with reference to FIG. 14.

Figure 14:
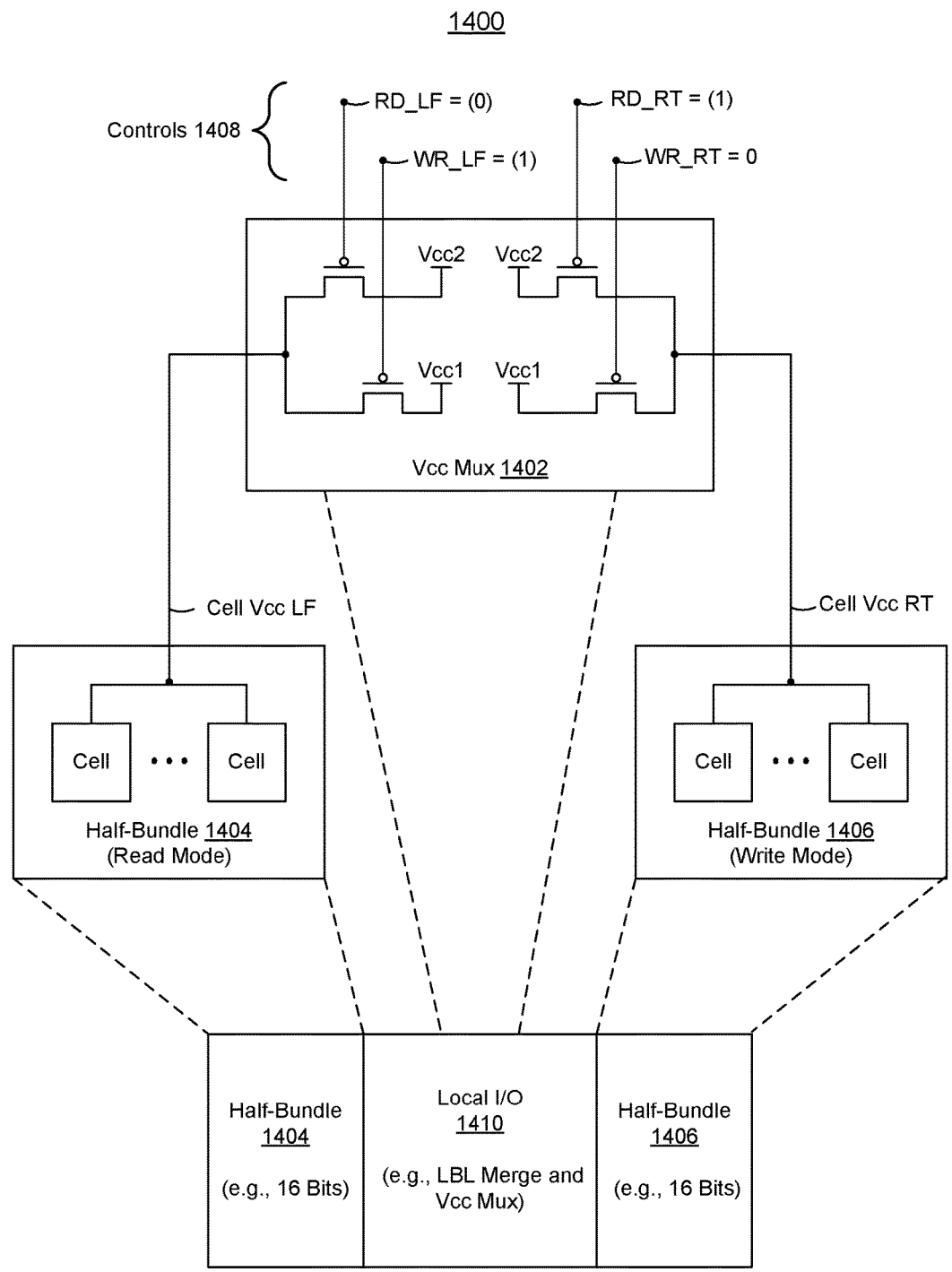
FIG. 14 is a block diagram of a memory system including a voltage multiplexer to control operating voltages of each of multiple subsets of bit cells.

FIG. 14 is a block diagram of a memory system 1400, including a Vcc mux 1402 to control operating voltages of each of multiple subsets of bit cells, illustrated here as first and second half-bundles 1404 and 1406. Methods and systems disclosed herein are not, however, limited to half-bundles.

Vcc mux 1402 may be implemented to independently control the operating voltage for each of half-bundle 1404 and half-bundle 1406.

For example, Vcc mux 1402 may be implemented to maintain operating voltages half-bundle 1404 and half-bundle 1406 at Vcc1 in retention mode and/or write mode, and to increase or switch the operating voltage to Vcc2 for one of half-bundles 1404 and 1406 when a read operation is directed to a bit cell within the half-bundle.

Vcc mux 1402 may be implemented to provide half-bundle based Vcc control based on one or more clocks and/or controls, which may have voltage swings of Vcc2, may be generated in pre-decoder logic and/or timer logic, and/or may be functionally equivalent to local bit line (LBL) pre-charge signals.

In FIG. 14, example logic states provided for controls RD_LF, WR_LF, RD_RT, and WR_RT, corresponding to read mode for half-bundle 1404 (i.e., Vcc=Vcc2), and write mode for half-bundle 1406 (i.e., Vcc=Vcc1). Final outputs of Vcc mux 1402 may be driven by a dual-output, split-level, level-shifter such as described in one or more examples herein.

Vcc mux 1402 may be implemented on an integrated circuit (IC) die within local input/output circuitry 1410 of half-bundles 1404 and 1406, such as described below with reference to FIG. 15.

Figure 15:
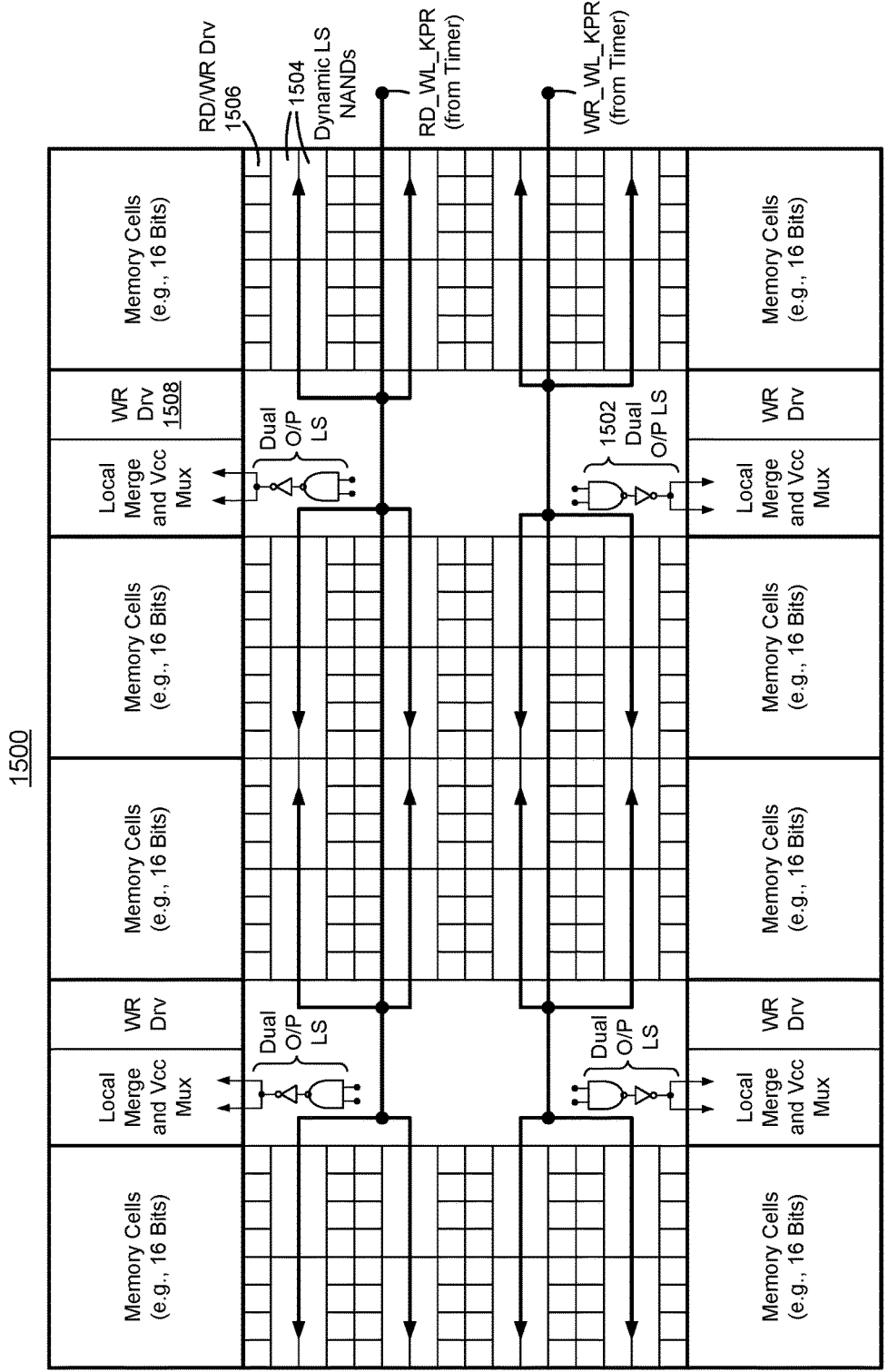
FIG. 15 is a floor plan of memory bit cells and decoder circuitry.

FIG. 15 is a floor plan 1500 of memory bit cells and decoder circuitry, one or more of which may be implemented as described in one or more examples herein.

In FIG. 15, Vcc mux circuitry is placed within local I/O areas of corresponding bit cells. For example, a dual-output, split-level, level-shifter 1502 is placed with LBL pre-charge logic in a decoder gap area associated with LBL merge logic.

Dynamic level-shifting NANDs may be located in decoder areas, as illustrated here at 1504, and may receive corresponding RD_WL_KPR and WR_WL_KPR controls from timer logic. As described further above, dynamic level-shifting NANDs may be implemented instead of static NANDs with little or no overall increase in area.

RWL drivers and WWL drivers may be located in corresponding RD and WR decoder areas, as illustrated here with a RD/WR Drv 1506. Alternatively, one or more write bit line drivers may be placed in a LBL merge area, as illustrated here with a WR Drv 1508.

Methods and systems disclosed herein may be implemented to provide bit cell Vcc boosting, RWL boosting, and/or WWL boosting.

RWL boosting and bit cell Vcc boosting may enable a larger "on" current for the read port without necessitating a larger read port. Also, an RWL-only boosting mode may be enabled by boosting the RWL without increasing bit cell operating voltage.

WWL boosting may improve contention without necessitating a larger write access device and/or without reducing a voltage threshold (VTH) of the write access device.

WWL boosting may improve write completion by writing a "1" to a second write access device.

WWL boosting may be implemented without reducing a dynamic retention margin of unselected cells of the same column.

Dynamic boosting, as disclosed herein, may be implemented with a Vmax voltage, while other circuitry, such as a WL pre-decoder, sense circuits, timer, and/or column I/O may operate at a lower core Vcc, or Vmin. Dynamic boosting may permit relatively aggressive core Vcc scaling, or Vmin reduction, which may improve overall energy efficiency.

Methods and systems disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, and/or a combination of integrated circuit packages.

Methods and systems disclosed herein may be implemented with respect to one or more of a variety of systems, such as described below with reference to FIG. 16. Methods and systems disclosed herein are not, however, limited to the example of FIG. 16.

Figure 16:
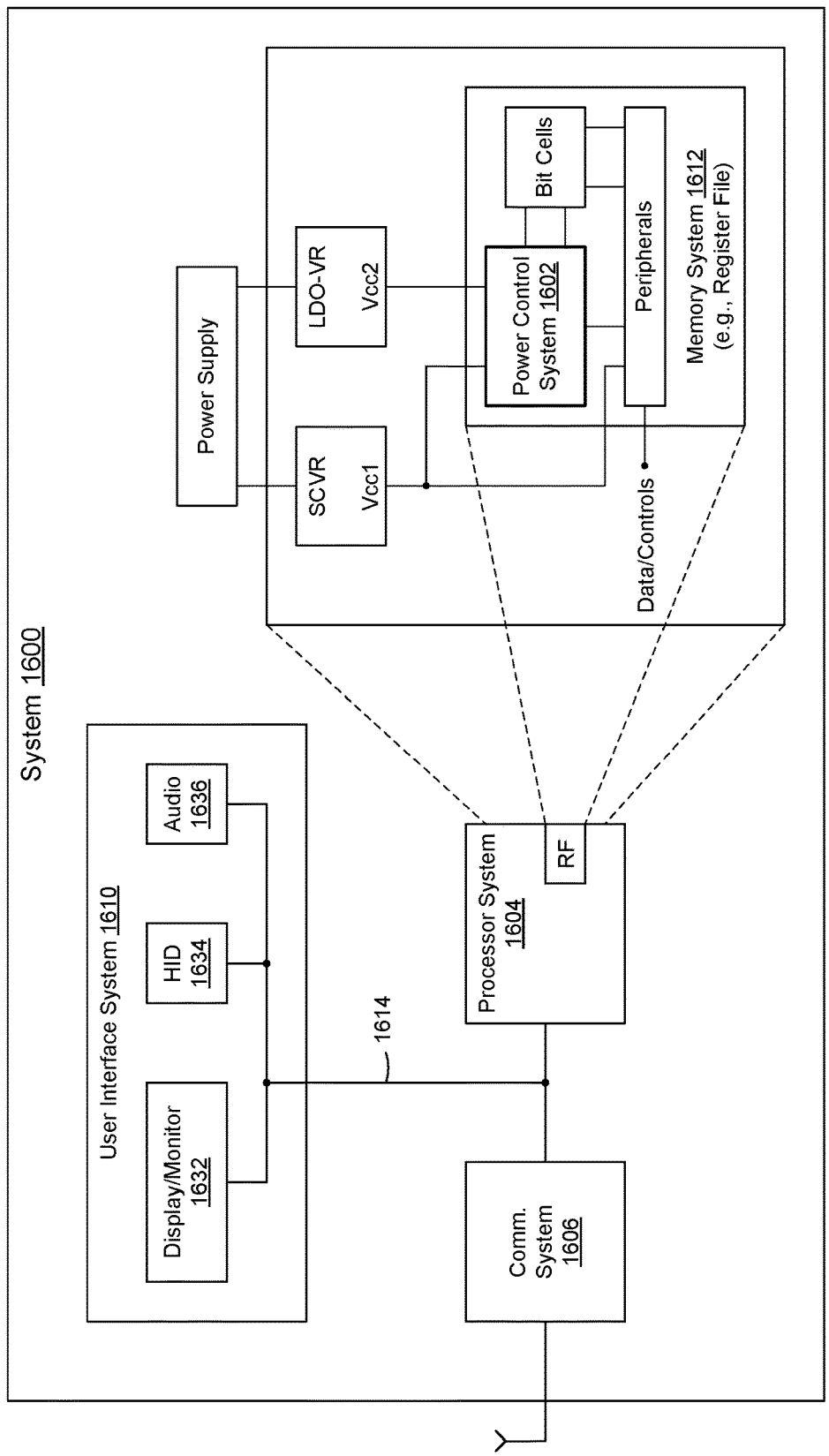
FIG. 16 is a block diagram of a system including a power control system and one or more of a processor system, a communication system, and a user interface system.

FIG. 16 is a block diagram of a system 1600, including a power control system 1602, and one or more of a processor system 1604, a communication system 1606, and a user interface system 1610. System 1600 may further include communication infrastructure 1614 to permit processor system 1604, communication system 1606 and/or user interface system 1610 to communicate with one another.

Power control system 1602 may be implemented to provide a multi-Vcc environment for a portion of processor 1604, communication system 1606, and/or user interface system 1610, such as described in one or more examples herein.

In the example of FIG. 16, multi-Vcc power control system 1602 is implemented as part of a memory system 1612, which may represent a register file or low-level cache of processor system 1604.

Communication system 1606 may be implemented to interface with a communication network, which may include a wired and/or wireless communication system.

User interface system 1610 may include a monitor or display 1632 to display information from processor 1604.

User interface system 1610 may include a human interface device (HID) 1634 to provide user-input to processor 1604 and/or communication system 1606. HID 1634 may include, for example and without limitation, one or more of a key board, a cursor device, a touch-sensitive device, and or a motion and/or image sensor. HID 1634 may include a physical device and/or a virtual device, such as a monitor-displayed or virtual keyboard.

User interface system 1610 may include an audio system 1636 to receive and/or output audible sound.

System 1600 or portions thereof may be implemented within one or more integrated circuit dies, and may be implemented as a system-on-a-chip (SoC).

System 1600 may correspond to, for example and without limitation, a computer system, a personal communication device, and/or a television set-top box.

System 1600 may include a housing, and one or more of processor system 1604, communication system 1606, and user interface system 1610, or portions thereof may be positioned within the housing. The housing may include, without limitation, a rack-mountable housing, a desk-top housing, a lap-top housing, a notebook housing, a net-book housing, a set-top box housing, a portable housing, and/or other conventional electronic housing and/or future-developed housing.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. An apparatus comprising:
a power control circuitry to provide one of first or second supply voltages according to one or more controls; and
a memory cell coupled to the power control circuitry, the memory cell to receive one of the first or second supply voltages,
wherein the power control circuitry includes:
a multiplexer having an output coupled to a supply node of the memory cell; and
a control circuitry coupled to the multiplexer,
wherein the multiplexer comprises:
a first device coupled to a first power supply node to receive the first supply voltage, the first device controllable by a first output of the control circuitry; and
a second device coupled to a second power supply node to receive the second supply voltage, the second device controllable by a second output of the control circuitry, and wherein the first output is complementary to the second output such that one of the first or second devices is turned on.

2. The apparatus of claim 1, wherein the one or more controls include a clock.

3. The apparatus of claim 1, wherein the power control circuitry is to provide the first supply voltage to the memory cell in standby mode and write mode.

4. The apparatus of claim 1, wherein the power control circuitry is to provide the second supply voltage to the memory cell in read mode.

5. The apparatus of claim 1, wherein the memory cell is to receive a write word-line (WWL) and a read word-line (RWL), wherein RWL is set to the second supply voltage during a read mode, wherein the memory cell is to receive the second supply voltage during the read mode, and wherein the WWL is set to ground during the read mode.

6. The apparatus of claim 5, wherein the WWL is set to the second supply voltage during a write mode, wherein the memory cell is to receive the first supply voltage during the write mode, and wherein the RWL is set to ground during the write mode.

7. The apparatus of claim 1, wherein the first supply voltage is generated on-die.

8. The apparatus of claim 1, wherein the first supply voltage is generated by a switched-capacitor voltage regulator.

9. The apparatus of claim 1, wherein the first supply voltage is lower than the second supply voltage.

10. An apparatus comprising:
a power control circuitry to provide one of first or second supply voltages according to one or more controls; and
a memory cell coupled to the power control circuitry, the memory cell to receive one of the first or second supply voltages,
wherein the memory cell is to receive a write word-line (WWL) and a read word-line (RWL),
wherein RWL is set to the second supply voltage during a read mode,
wherein the memory cell is to receive the second supply voltage during the read mode,
wherein the WWL is set to ground during the read mode,
wherein the WWL is set to the second supply voltage during a write mode,
wherein the memory cell is to receive the first supply voltage during the write mode, and
wherein the RWL is set to ground during the write mode.

11. The apparatus of claim 10, wherein the first supply voltage is generated on-die.

12. The apparatus of claim 10, wherein the first supply voltage is generated by a switched-capacitor voltage regulator.

13. The apparatus of claim 10, wherein the second supply voltage is generated by a low dropout voltage regulator.

14. The apparatus of claim 10, wherein the first supply voltage is lower than the second supply voltage.

15. A system comprising:
a processor including a memory block, wherein memory block includes:
a power control circuitry to provide one of first or second supply voltages according to one or more controls; and
a memory cell coupled to the power control circuitry, the memory cell to receive one of the first or second supply voltages,
wherein the power control circuitry includes:
a multiplexer having an output coupled to a supply node of the memory cell; and
a control circuitry coupled to the multiplexer; and
wherein the multiplexer comprises:
a first device coupled to a first power supply node to receive the first supply voltage, the first device controllable by a first output of the control circuitry; and
a second device coupled to a second power supply node to receive the second supply voltage, the second device controllable by a second output of the control circuitry, wherein the first output is complementary to the second output such that one of the first or second devices is turned on; and
a communication interface to allow the processor to communicate with another device.

16. The system of claim 15, wherein the processor includes a switched-capacitor voltage regulator which generates the first supply voltage.

17. The system of claim 15, wherein the processor includes a low dropout voltage regulator which generates the second supply voltage.

18. The system of claim 15, wherein the power control circuitry is to provide the first supply voltage to the memory cell in a standby mode or a write mode, and wherein the power control circuitry is to provide the second supply voltage to the memory cell in the read mode.

19. The system of claim 15, wherein:
the memory cell is to receive a write word-line (WWL) and a read word-line (RWL),
RWL is set to the second supply voltage during a read mode,
the memory cell is to receive the second supply voltage during the read mode,
the WWL is set to ground during the read mode,
the WWL is set to the second supply voltage during a write mode,
the memory cell is to receive the first supply voltage during the write mode, and
the RWL is set to ground during the write mode.

* * * * *